(12) United States Patent
Nagasawa et al.

(10) Patent No.: US 8,431,832 B2
(45) Date of Patent: Apr. 30, 2013

(54) CIRCUIT BOARD, MOUNTING STRUCTURE, AND METHOD FOR MANUFACTURING CIRCUIT BOARD

(75) Inventors: Tadashi Nagasawa, Yasu (JP); Katsura Hayashi, Yasu (JP)

(73) Assignee: Kyocera Corporation, Kyoto (JP)

( * ) Notice: Subject to any disclaimer, the term of this patent is extended or adjusted under 35 U.S.C. 154(b) by 336 days.

(21) Appl. No.: 12/745,223

(22) PCT Filed: Nov. 28, 2008

(86) PCT No.: PCT/JP2008/071741
§ 371 (c)(1),
(2), (4) Date: Sep. 2, 2010

(87) PCT Pub. No.: WO2009/069791
PCT Pub. Date: Jun. 4, 2009

(65) Prior Publication Data
US 2011/0051386 A1    Mar. 3, 2011

(30) Foreign Application Priority Data

Nov. 28, 2007 (JP) ................................. 2007-307097
Dec. 25, 2007 (JP) ................................. 2007-331877

(51) Int. Cl.
*H05K 1/11* (2006.01)
*H01K 3/10* (2006.01)

(52) U.S. Cl.
USPC ............................................ 174/262; 29/852

(58) Field of Classification Search .......... 174/262–266; 361/792–795; 29/852–853
See application file for complete search history.

(56) References Cited

U.S. PATENT DOCUMENTS 6,392,301 B1 * 5/2002 Waizman et al. ............. 257/774
7,985,930 B2 * 7/2011 Asai et al. ..................... 174/264

FOREIGN PATENT DOCUMENTS

| JP | 8-116174 | 5/1996 |
| JP | 9-312479 | 12/1997 |
| JP | 11-046066 | 2/1999 |
| JP | 2003-142823 | 5/2003 |
| JP | 2006-253189 | 9/2006 |

* cited by examiner

*Primary Examiner* — Jeremy Norris
(74) *Attorney, Agent, or Firm* — DLA Piper LLP (US)

(57) ABSTRACT

A circuit board (2) includes an insulation layer (7) where a via conductor (10) is embedded. The via conductor (10) includes: a first conductor portion (10a) having an lower portion narrower than an upper portion; and a second conductor portion (10b) which is formed immediately below the first conductor portion (10a), connected to the first conductor portion (10a), and has a maximum width greater than the upper end width of the first conductor portion (10a). The insulation layer (7) has a plurality of indentations (T1a, T1b) on the surface in contact with the via conductor (10). Convex portions (T2a, T2b) of the via conductor are arranged in the indentations (T1a, T1b).

5 Claims, 5 Drawing Sheets

CIRCUIT BOARD, MOUNTING STRUCTURE, AND METHOD FOR MANUFACTURING CIRCUIT BOARD

CROSS-REFERENCE TO THE RELATED APPLICATIONS

This application is a national stage of international application No. PCT/JP2008/071741, filed on Nov. 28, 2008, and claims the benefit of priority under 35 USC 119 to Japanese Patent Application No. 2007-307097, filed on Nov. 28, 2007 and Japanese Patent Application No. 2007-331877, filed on Dec. 25, 2007, the entire contents of all of which are incorporated herein by reference.

TECHNICAL FIELD

The present invention relates to a technology associated with a circuit board used for electronic apparatuses (e.g., audiovisual apparatuses, electrical appliances, communication apparatuses, computer apparatuses, and the peripheral devices thereof).

BACKGROUND ART

Mounting structures obtained by mounting semiconductor devices such as IC (integrated circuit) and LSI (large scale integration) chips have been known.

With recent miniaturization of electronic apparatuses, a circuit board in which insulating layers and conductive layers are alternately stacked multiple times in the vertical direction has been demanded as the circuit board described above.

Upper and lower conductive layers are connected to each other through a via conductor having conductivity and embedded in the insulating layer. The via conductor has, for example, a tapered shape in which one of the upper end and the lower end is smaller in width than the other (e.g., refer to Patent Document 1).

However, when such a via conductor having a tapered shape is used, stress is easily concentrated at the end of the via conductor having a smaller width compared with the end of the via conductor having a larger width, which poses a problem in that the via conductor is easily detached from the insulating layer. The detachment of the via conductor results in faulty conduction of the circuit board, which decreases the electrical reliability of the circuit board.

[Patent Document 1] Japanese Unexamined Patent Application Publication No. 8-116174

DISCLOSURE OF INVENTION

An object of the present invention is to effectively suppress detachment of a via conductor in a circuit board and to improve the electrical reliability.

In an embodiment, the present invention relates to a circuit board including an insulating layer in which a via conductor is embedded. In another embodiment, the present invention relates to a mounting structure including the circuit board and a semiconductor device mounted on the circuit board using a flip chip packaging technology.

The via conductor includes a first conducting portion including a lower portion smaller in width than the upper portion thereof; and a second conducting portion formed directly below the first conducting portion and connected to the first conducting portion, the second conducting portion having a maximum width larger than a width of an upper end of the first conducting portion.

The insulating layer includes a plurality of depressions in a surface that contacts the via conductor, and projections of the via conductor are arranged in the depressions.

According to the present invention, electrical connecting reliability can be improved by effectively suppressing detachment of a via conductor.

Figure 1:
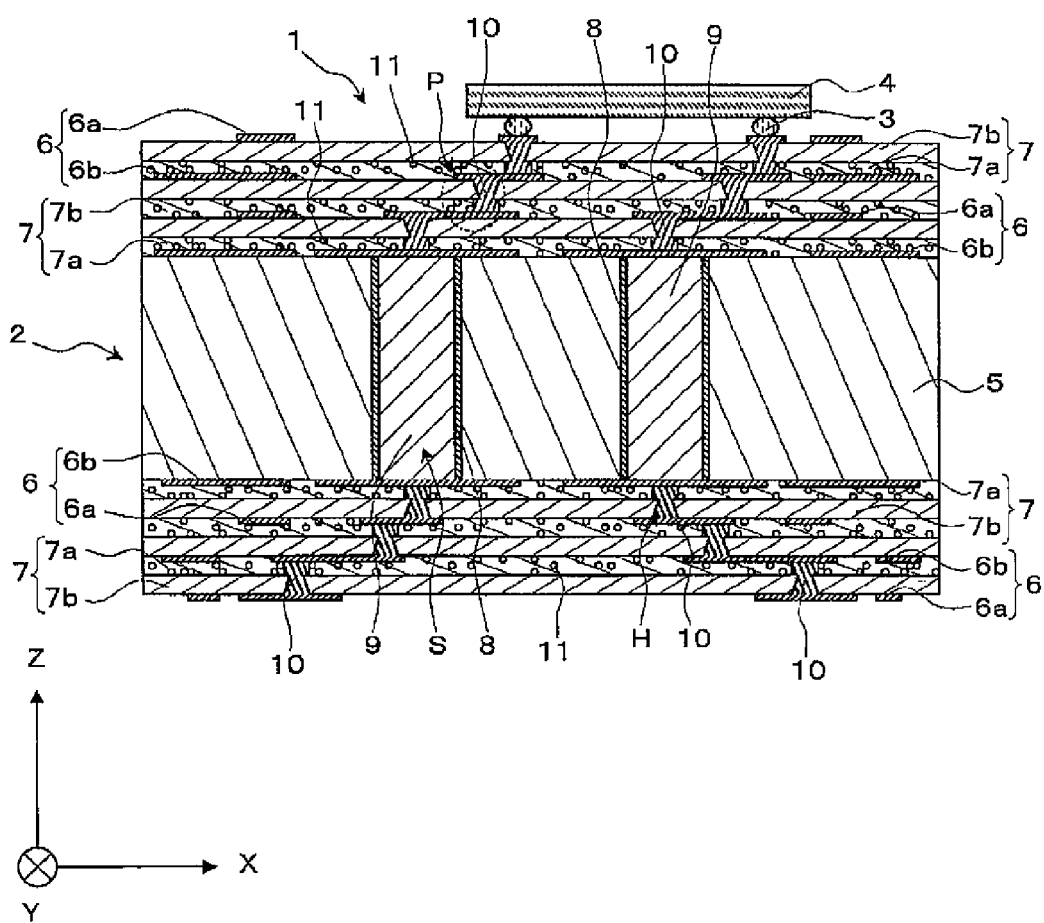
FIG. 1 is a sectional view of a mounting structure according to an embodiment of the present invention.

REFERENCE NUMERALS 1 mounting structure
2 circuit board
3 bump
4 semiconductor device
5 core substrate
6 conductive layer
$6a$ signal line
$6b$ ground layer
7 insulating layer
$7a$ resin layer
$7b$ film layer
8 through hole conductor
9 insulator
10 via conductor
$10a$ first conducting portion
$10b$ second conducting portion
11 filler
S through hole
H penetrating hole
H1 first opening
H2 second opening
$T1a$, $T1b$ depressions
$T2a$, $T2b$ projections

BEST MODE FOR CARRYING OUT THE INVENTION

A circuit board and a mounting structure according to an embodiment of the present invention are described below in detail with reference to the attached drawings.

A mounting structure 1 shown in FIG. 1 is used for various electronic apparatuses such as audiovisual apparatuses, electrical appliances, communication apparatuses, computer apparatuses, and the peripheral devices thereof. The mounting structure 1 includes a circuit board 2 and a semiconductor device 4 such as IC or LSI, the semiconductor device 4 being mounted on the circuit board 2 through a bump 3 such as solder using a flip chip packaging technology.

The circuit board 2 includes a core substrate 5, conductive layers 6, and insulating layers 7.

The core substrate 5 can be produced by stacking sheets obtained by impregnating a base material with a thermosetting resin and then by curing it.

An example of the base material includes a material obtained by weaving lengthwise and widthwise, for example, glass fiber, a polyparaphenylene benzobisoxazole resin, or a wholly aromatic polyamide resin.

Examples of the thermosetting resin include an epoxy resin, a bismaleimide triazine resin, and a cyanate resin. The core substrate 5 can also be produced from a low thermal expansion resin without using the base material. The core substrate 5 may be entirely produced using only a low thermal expansion resin or may be produced by alternately stacking sheets composed of a low thermal expansion resin with adhesive resins interposed therebetween.

Examples of the low thermal expansion resin used for the core substrate 5 include polyparaphenylene benzobisoxazole resins, wholly aromatic polyamide resins, wholly aromatic polyester resins, polyimide resins, liquid crystal polymer resins. Among these, polyparaphenylene benzobisoxazole resins are preferably used. The coefficient of thermal expansion of the polyparaphenylene benzobisoxazole resin is as low as −5 ppm/° C. or more and 5 ppm/° C. or less. With such a low thermal expansion resin, the thermal expansion of the core substrate 5 itself can be suppressed. A coefficient of thermal expansion is in conformity with JIS K 7197.

The core substrate 5 includes a through hole S, a through hole conductor 8, and an insulator 9 with which a region surrounded by the through hole conductor 8 is filled.

The through hole S is a space where the through hole conductor 8 is formed and penetrates the core substrate 5 in the up-and-down direction.

The through hole conductor 8 electrically connects conductive layers 6 located above and below the core substrate 5 and is formed along an inner wall surface of the through hole S. The through hole conductor 8 is composed of a conductive material such as copper, silver, gold, aluminum, nickel, or chromium.

The insulator 9 is used to fill the remaining space surrounded by the through hole conductor 8. The insulator 9 is composed of a polyimide resin, an acrylic resin, an epoxy resin, a cyanate resin, a fluorocarbon resin, a silicon resin, a polyphenylene ether resin, a bismaleimide triazine resin, or the like. By forming the insulator 9, the via conductors 10 described below can be formed immediately above and below the insulator 9, and the length of a wiring line routed from the through hole conductor 8 can be shortened, which can achieve the miniaturization of the circuit board 2.

The conductive layers 6 are alternately stacked on one principal surface and the other principal surface of the core substrate 5, and include signal lines 6a and ground layers 6b. The conductive layers 6 are composed of a metal material such as copper, silver, gold, aluminum, nickel, or chromium.

Each of the signal lines 6a is formed in a line shape and has a function of transmitting a certain electrical signal. The signal line 6a is disposed so as to face each of the ground layers 6b through an insulating layer 7.

Each of the ground layers 6b is formed in a flat plate shape and has a function of setting a common potential for the semiconductor device 4, for example, a ground potential.

The insulating layer 7 on the core substrate 5 includes a resin layer 7a and a film layer 7b.

The resin layer 7a is composed of a thermosetting resin, a thermoplastic resin, or the like. The coefficient of thermal expansion is set to 15 ppm/° C. or more and 80 ppm/° C. or less and the thickness after drying is set to 1 μm or more and 15 μm or less.

At least one of a polyimide resin, an acrylic resin, an epoxy resin, a urethane resin, a cyanate resin, a silicon resin, a bismaleimide triazine resin, and the like can be used as the thermosetting resin for the resin layer 7a. Since the thermoplastic resin needs to have thermal resistance so as to endure heat treatment during reflow soldering, such a resin preferably has a softening temperature of 200° C. or higher. Examples of the thermoplastic resin include polyether ketone resins, polyethylene terephthalate resins, and polyphenylene ether resins.

The resin layer 7a may include a large number of fillers 11. If the resin layer 7a includes fillers 11, the viscosity of the resin layer 7a before curing can be adjusted, whereby the resin layer 7a can be formed at a thickness closer to a desired thickness of the resin layer 7a.

The fillers 11 have a spherical shape and are composed of, for example, silicon oxide (silica), silicon carbide, aluminum oxide, aluminum nitride, or aluminum hydroxide. For example, the fillers 11 have a diameter of 0.05 μm or more and 6 μm or less and a coefficient of thermal expansion of −5 ppm/° C. or more and 5 ppm/° C. or less.

The film layer 7b is used to achieve the flatness of the circuit board 2 and is bonded to the core substrate 5 through the resin layer 7a.

After the film layer 7b is solidified, the film layer 7b can be fixed onto the core substrate 5 or the conductive layer 6 by bonding the film layer 7b to the core substrate 5 or the conductive layer 6 through an adhesive that later becomes the resin layer 7a, heat-pressurizing with a heating press machine or the like, and then performing cooling.

As a material for forming the film layer 7b, a material whose thickness can be precisely controlled to achieve the flatness of the circuit board 2, for example, a material that can be elastically deformed and has high thermal resistance and sufficient hardness is preferred. Examples of the material having such characteristics include polyparaphenylene benzobisoxazole resins, wholly aromatic polyamide resins, wholly aromatic polyester resins, and liquid crystal polymer resins. The coefficient of thermal expansion of the film layer 7b is, for example, −10 ppm/° C. or more and 10 ppm/° C. or less.

The thickness of the film layer 7b is set to, for example, 2 μm or more and 20 μm or less, and the difference in thickness between the resin layer 7a and the film layer 7b is set to 7 μm or less. Herein, the difference in thickness between the resin layer 7a and the film layer 7b is a difference in thickness therebetween after the resin layer 7a is dried. The thickness of the film layer 7b is set so as to be larger than that of the resin layer 7a.

Figure 2:
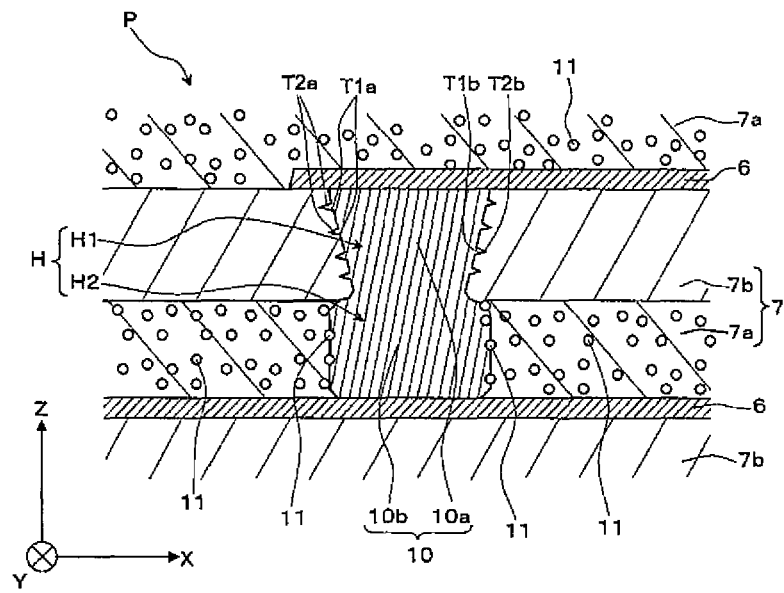
FIG. 2 is an enlarged sectional view of a via conductor shown in FIG. 1.
Figure 3:
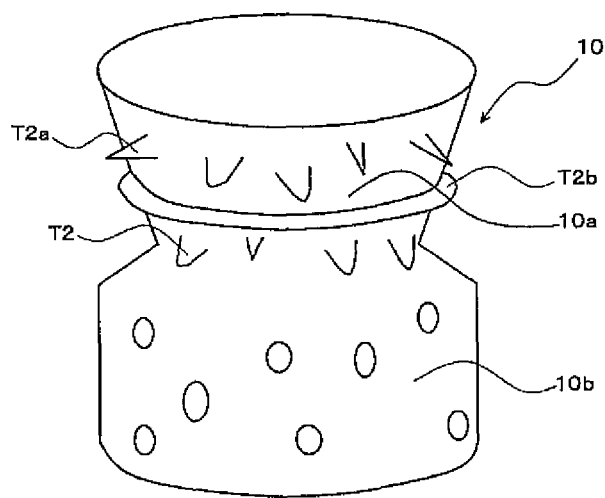
FIG. 3 is a schematic perspective view of a via conductor shown in FIG. 1.

As shown in FIG. 2, the insulating layer 7 includes a penetrating hole H penetrating the insulating layer 7 in the vertical direction and the via conductor 10.

The penetrating hole H is formed by irradiating the insulating layer 7 with a laser beam in the direction from the film layer 7b side to the resin layer 7a side. The penetrating hole H includes a first opening H1 and a second opening H2 formed directly below the first opening H1. Herein, a connecting portion between the first opening H1 and the second opening H2 lies in the film layer 7b. Thus, the level of the connecting portion between the first opening H1 and the second opening H2 is different from that of a connecting portion between the film layer 7b and the resin layer 7a.

In the first opening H1, the lower portion is smaller in width than the upper portion. The first opening H1 has a maximum opening diameter at the upper end whereas a minimum opening diameter at the lower end. The maximum opening diameter of the first opening H1 is set to, for example, 3.5μ or more and 30 μm or less. The width of the lower end of the first opening H1 is set to, for example, 3 μm or more and 25 μm or less.

The second opening H2 has a maximum opening diameter larger than that of the first opening H1. The second opening H2 communicates with the first opening H1. In the second opening H2, the lower end corners located at the boundary portions between the resin layer 7a and the film layer 7b and between the resin layer 7a and the conductive layer 6 are formed so as to be curved. Such curved portions can be formed by decreasing the flow rate of an etching solution for etching the resin layer 7a to increase the size of the region where the resin layer 7a is left. Because the lower end corners of the second opening H2 are curved, the second opening H2 has a maximum opening diameter at a cylindrical portion that is apart from the film layer 7b and the conductive layer 6. The maximum opening diameter of the second opening H2 is set to, for example, 4 µm or more and 50 µm or less.

The penetrating hole H includes a plurality of depressions T1a and T1b formed in the portion corresponding to the film layer 7b. The depressions T1a are arranged apart from each other, and the depressions T1b whose inner wall surfaces are curved surfaces are formed in a ring shape along the circumference in a continuous manner. The depressions T1a and T1b are depressed in the direction parallel to the planar direction of the film layer 7b. The depressions T1a and T1b are formed so as to have a depth of, for example, 0.1 µm or more and 3 µm or less. By setting the depth of the depressions T1a and T1b to 0.1 µm or more, an anchor effect can be effectively provided. By setting the depth of the depressions T1a and T1b to 3 µm or less, the degradation of the resin characteristics of the insulating layer 7, which is caused by a laser beam or a chemical solution, can be effectively suppressed.

The shape of the depressions T1a and T1b is determined in accordance with a molecular structure of a material constituting the film layer 7b and the orientation characteristics of the molecular structure.

The via conductor 10 is used for electrically connecting the upper and lower conductive layers 6, and the penetrating hole H is filled with the via conductor 10. In the via conductor 10, some of the fillers 11 contained in the resin layer 7a are embedded in the via conductor 10 at the interface between the via conductor 10 and the resin layer 7a. The via conductor 10 includes a first conducting portion 10a corresponding to the portion of the first opening H1 and a second conducting portion 10b corresponding to the portion of the second opening H2.

The first conducting portion 10a is formed to follow the shape of the first opening H1 such that the lower end is smaller in width than the upper end. The first conducting portion 10a has the maximum diameter at the upper end that contacts the conductive layer 6, which is set to, for example, 3.5 µm or more and 30 µm or less.

The first conducting portion 10a includes projections T2a and T2b formed in the depressions T1a and T1b in the first opening H1. The shape of the projections T2a corresponds to the shape of the depressions T1a of the first opening H1. Herein, the shape of the depressions T1a is determined in accordance with a molecular structure of a material constituting the film layer 7b and the orientation characteristics of the molecular structure. Therefore, the projections T2a have a conical shape, a cylindrical shape, a flat plate shape, a needle-like shape, or a shape in which these shapes are continuously formed. The projections T2b are formed in a ring shape so as to follow the shape of the depressions T1b.

Since the projections T2a and T2b constitute part of the first conducting portion 10a, an anchor effect is produced by forming the projections T2a and T2b in the plurality of depressions T1a and T1b formed in the film layer 7b. As a result, the adhesive strength between the via conductor 10 and the film layer 7b can be increased.

The second conducting portion 10b is formed directly below the first conducting portion 10a and connected to the first conducting portion 10a. The second conducting portion 10b has a cylindrical body portion which is larger in width than the lower end of the first conducting portion 10a. The lower end corners (located at the boundary portions between the resin layer 7a and the film layer 7b and between the resin layer 7a and the conductive layer 6) of the second conducting portion 10b are curved. The body portion of the second conducting portion 10b is a cylindrical region, where the resin layer 7a is etched so as to have a width larger than that of the upper end of the first conducting portion 10a. The maximum diameter of the second conducting portion 10b is, for example, 4 µm or more and 50 µm or less, which is larger than the maximum diameter of the first conducting portion 10a. By curving the corners of the second conducting portion 10b, external force is not easily applied to the corners, which can suppress cracking caused on the corners. As a result, the electrical reliability of the via conductor 10 can be maintained.

Such a via conductor 10 is composed of a conducive material such as copper, silver, gold, aluminum, nickel, or chromium.

The semiconductor device 4 is composed of a material having a coefficient of thermal expansion close to that of the insulating layer 7. Examples of the material include silicon, germanium, gallium arsenide, gallium arsenide phosphide, gallium nitride, and silicon carbide. A semiconductor device having a thickness of, for example, 0.1 mm or more and 1 mm or less can be used as the semiconductor device 4.

According to the mounting structure 1 or the circuit board 2, when an etching solution penetrates into the boundary portions between the resin layer 7a and the film layer 7b and between the resin layer 7a and the conductive layer 6, part of the via conductor 10 may enter the boundary portions. In this case, the contact area of the via conductor 10 and the conductive layer 6 or the contact area of the via conductor 10 and the insulating layer 7 becomes large, and thus the detachment between the via conductor 10 and the conductive layer 6 or the detachment between the via conductor 10 and the insulating layer 7 can be suppressed. Furthermore, if the depressions T1a and T1b are formed in the direction parallel to the surface of the insulating layer 7a, the thermal expansion of the insulating layer 7a in the vertical direction when heat is applied to the circuit board 2 can be reduced due to the projections T1a and T2b formed in the depressions T1a and T1b.

If the connecting portion between the first opening H1 and the second opening H2 is located at the interface between the film layer 7b and the resin layer 7a, the application of external heat causes thermal stress which is easily concentrated at the connecting portion between the film layer 7b and the resin layer 7a, that is, at the interface between the film layer 7b and the resin layer 7a because the coefficients of thermal expansion between the film layer 7b and the resin layer 7a are different from each other. Furthermore, the opening diameter of the penetrating hole H suddenly changes between the lower end of the first opening H1 and the upper end of the second opening H2, and the lower end of the first opening H1 has the smallest opening diameter in the opening diameter of the penetrating hole H. Therefore, when stress is applied to the connecting portion between the first opening H1 and the second opening H2, cracking may be caused on the via conductor 10. In other words, if the connecting portion between the first opening H1 and the second opening H2 is located at the interface between the film layer 7b and the resin layer 7a, stress is applied to the connecting portion between the first opening H1 and the second opening H2 because of the thermal stress applied to the interface between the film layer 7b and the resin layer 7a, which easily causes cracking on the via conductor 10.

On the other hand, according to the embodiment of the present invention, the connecting portion between the first opening H1 and the second opening H2 (the connecting portion between the first conducting portion 10a and the second conducting portion 10b) lies in the film layer 7b. Thus, thermal stress at the interface between the film layer 7b and the resin layer 7a is not concentrated at the connecting portion between the first opening H1 and the second opening H2. This can suppress cracking caused on the via conductor 10. Furthermore, since the film layer 7b is excellent in hardness and has the depressions T1a and T1b formed therein, the adhesive strength between the film layer 7b and the via conductor 10 is higher than that between the resin layer 7a and the via conductor 10. Thus, by locating the connecting portion between the first conducting portion 10a and the second conducting portion 10b in the film layer 7b, the stress applied to the via conductor 10 in the film layer 7b can be reduced. As a result, the stress applied to the connecting portion between the first conducting portion 10a and the second conducting portion 10b can be reduced.

At the interface between the via conductor 10 and the resin layer 7a, which is an inner wall surface of the penetrating hole H, a large number of fillers 11 contained in the resin layer 7a are embedded in the via conductor 10. Part of the via conductor 10 is formed so as to cover some of the fillers, whereby the contact area between the fillers 11 and the via conductor 10 is increased and thus the adhesive strength therebetween can be increased. This can suppress the detachment between the via conductor 10 and the resin layer 7a.

As described above, according to the present embodiment, the adhesive strength between the via conductor 10 and the insulating layer 7 is increased and thus the via conductor 10 is not easily detached from the penetrating hole H, which can satisfactorily maintain the electrical connection of the via conductor 10. As a result, a circuit board with high electrical reliability and a mounting structure using the circuit board can be provided.

Figure 4A:
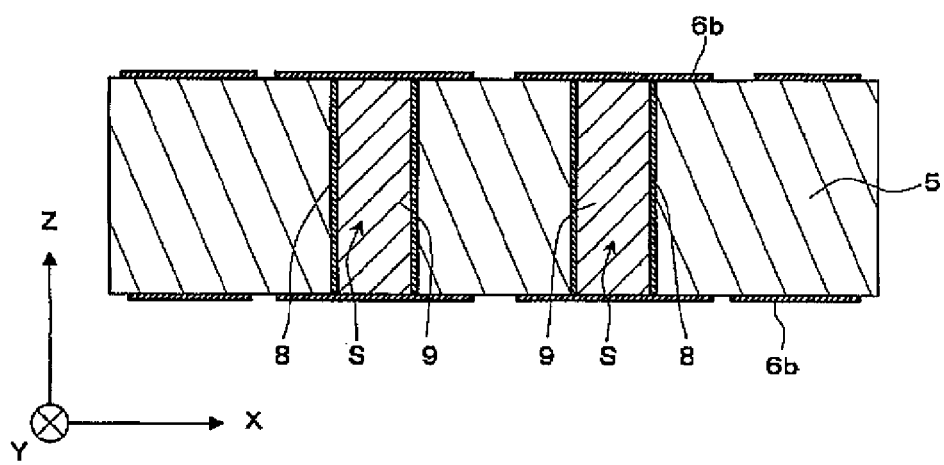
FIGS. 4A and 4B are sectional views for describing manufacturing steps of the mounting structure shown in FIG. 1.

A method for manufacturing the mounting structure 1 is now described with reference to FIGS. 4 to 6.

First, a core substrate 5 is prepared as a substrate including an insulating layer 7. The core substrate 5 is produced by heat pressurizing sheets in which a glass cloth obtained by weaving glass fibers lengthwise and widthwise is impregnated with a thermosetting resin such as an epoxy resin, a bismaleimide triazine resin, or a cyanate resin to cure it. Alternatively, a fiber having a low coefficient of thermal expansion, such as a wholly aromatic polyimide, a wholly aromatic polyester resin, a liquid crystal polymer, or the like may be used to reduce a thermal expansion of a circuit board 2. The thickness of the core substrate 5 is set to, for example, 0.3 mm or more and 1.5 mm or less.

Next, a plurality of through holes S that penetrate the core substrate 5 in the thickness direction are formed in the core substrate 5 by publicly known drilling or the like. A through hole conductor 8 is formed on an inner wall surface of each of the through holes S by performing electroless plating or the like. The opening diameter of the through hole S is set to, for example, 0.1 mm or more and 1 mm or less. The region surrounded by the through hole conductor 8 is then filled with, for example, a polyimide resin to form an insulator 9.

Subsequently, a material constituting ground layers 6b is applied to upper and lower surfaces of the core substrate 5 by publicly known plating, vapor deposition, CVD, sputtering, or the like. By applying a resist to the surface and performing exposure, development, and etching, the ground layers 6b are formed on the upper and lower surfaces of the core substrate 5. Thus, the core substrate 5 shown in FIG. 4A can be prepared.

Figure 4B:
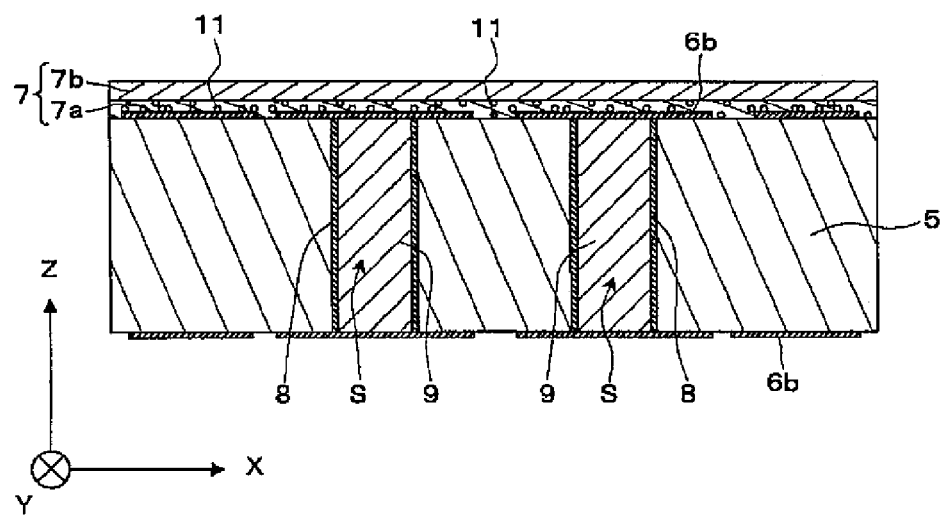

A film 7 to which an adhesive has been applied in advance by publicly known die coating or the like is attached to the upper surface of the ground layers 6b. By heat-pressurizing a film layer 7b and the adhesive using a vacuum heating press machine or the like and then cooling the film layer 7b and the adhesive, the film layer 7b can be fixed on the core substrate 5 as shown in FIG. 4B.

The adhesive becomes a resin layer 7a after heat-pressurizing and then the cooling. As a result, an insulating layer 7 including the film layer 7b and the resin layer 7a can be formed. The thickness of the film layer 7b is set to, for example, 7.5 μm. The thickness of the resin layer 7a is set to 3 μm. Thus, the core substrate 5 including the resin layer 7a can be prepared.

Figure 5A:
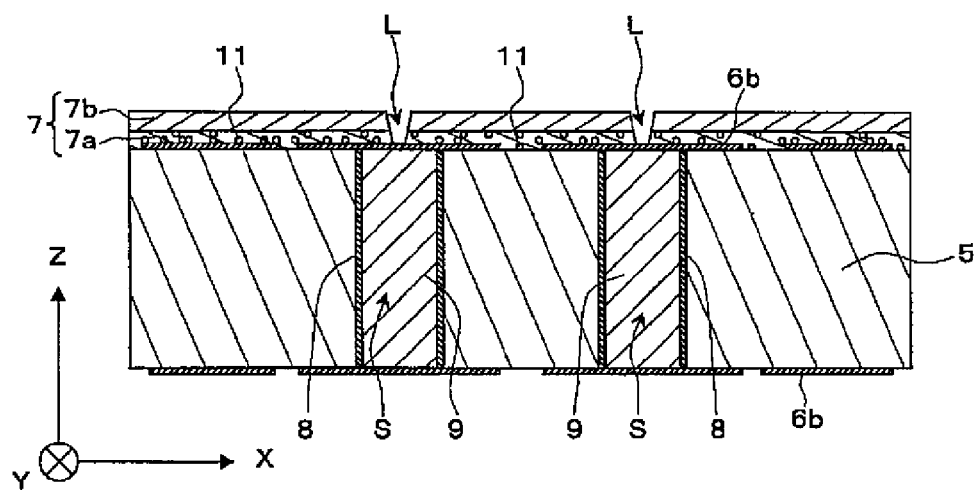
FIGS. 5A and 5B are sectional views for describing manufacturing steps of the mounting structure shown in FIG. 1.

Next, as shown in FIG. 5A, a laser penetrating hole L is formed in the insulating layer 7 using a YAG laser machine, a $CO_2$ laser machine, or the like. The laser penetrating hole L can be formed by irradiating one principal surface of the insulating layer 7 with a laser beam in the direction vertical to the principal surface of the insulating layer 7. The output of the laser beam is set to $1.0 \times 10^{-3}$ J or higher and $5.0 \times 10^{-1}$ J or lower. The laser penetrating hole L can be formed by irradiating the insulating layer 7 with the laser beam for $1.0 \times 10^{-3}$ sec or longer and 1.0 sec or shorter. The upper surface of the film layer 7b is first irradiated with the laser beam and the film layer 7b around the irradiated point is sublimated, whereby part of the film layer 7b is removed. Consequently, the laser penetrating hole L including a lower portion smaller in width than the upper portion thereof can be formed in the film layer 7b.

After the irradiation of the laser beam, burnt residues (called smears), which are part of the film layer 7b and part of the resin layer 7a, adhere to the bottom surface and the inner wall surface of the laser penetrating hole L. Therefore, a desmearing step of removing the burnt residues on the laser penetrating hole L is performed. In this desmearing step, for example, plasma treatment with a microwave is performed for about ten minutes using argon gas or oxygen gas. Furthermore, a first etching solution for removing the burnt residues is poured into the laser penetrating hole L. The first etching solution is a permanganic acid solution prepared by, for example, adding 20 to 40 g of permanganic acid and 35 to 45 g of sodium hydroxide to 1 L of distilled water. The substrate is immersed in the first etching solution while the first etching solution is warmed to 30 to 40° C. By stirring the etching solution or shaking the substrate, the first etching solution is poured into the laser penetrating hole L for two to four minutes. With the plasma treatment and the etching solution under these conditions, the burnt residues (called smears) subjected to the effect of drilling and the thermal effect of the laser beam can be removed, but the resin layer 7a is hardly etched.

Figure 5B:
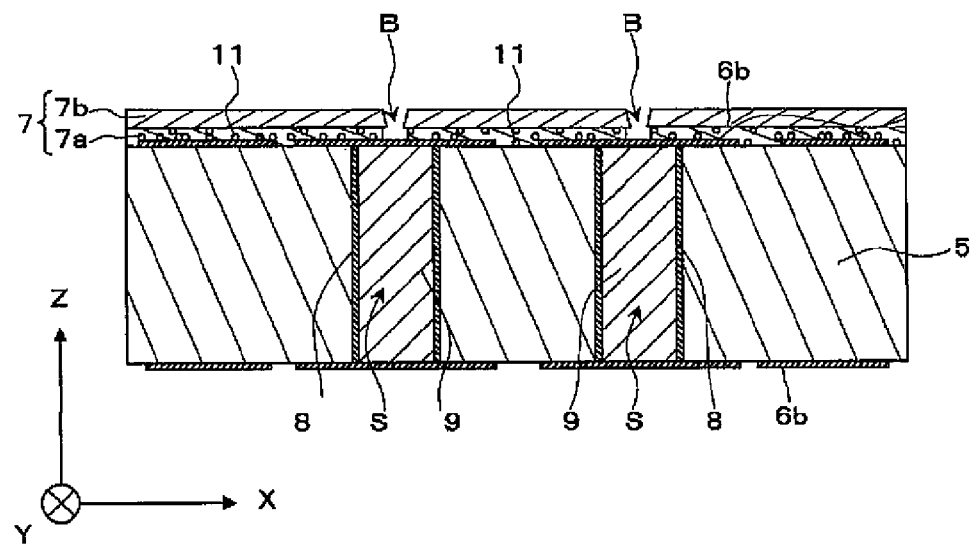

As shown in FIG. 5B, a second etching solution is poured into the laser penetrating hole L, and thus part of the resin layer 7a exposed in the laser penetrating hole L is etched in an X direction by 0.3 μm or more and 10 μm or less to form a penetrating hole H. The second etching solution is a permanganic acid solution prepared by, for example, adding 50 to 100 g of permanganic acid and 35 to 45 g of sodium hydroxide to 1 L of distilled water. The substrate is immersed in the second etching solution while the second etching solution is warmed to 50 to 70° C. By stirring the etching solution or shaking the substrate, the second etching solution is poured into the laser penetrating hole L for five to six minutes. Since the second etching solution has higher concentration and is treated at higher temperature than the first etching solution, the resin layer 7a can be etched rather than the film layer 7b. Because the film layer 7b is composed of a resin having chemical resistance, thermal resistance, and high strength, the film layer 7b is hardly etched even with the second etching solution. Herein, the entrance of the second etching solution decreases the stress applied to the end of the film layer 7b from the resin layer 7a in the laser penetrating hole L, and opens the cracks caused in the arrangement direction of molecules constituting the film layer 7b by thermal shock of the laser beam. Consequently, depressions T1a and T1b are formed in the film layer 7b. Furthermore, the end of the film layer 7b that contacts the resin layer 7a and is exposed from the laser penetrating hole L is gradually shaved off as the resin layer 7a is etched. Thus, a penetrating hole H can be formed. The depressions T1a and T1b are continuously formed in accordance with the arrangement of molecules constituting the film layer 7b.

Figure 6A:
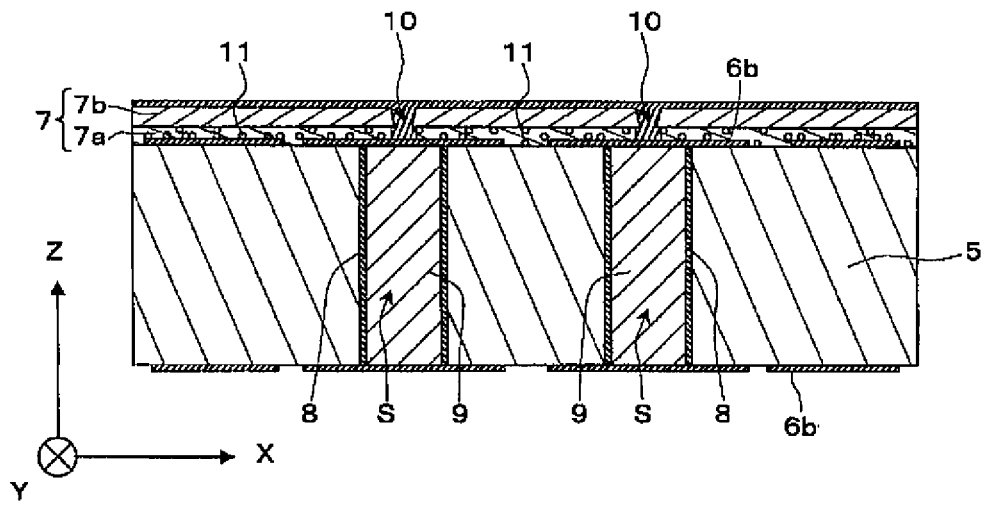
FIGS. 6A and 6B are sectional views for describing manufacturing steps of the mounting structure shown in FIG. 1.

As shown in FIG. 6A, plating is performed on one principal surface of the film layer 7b and a surface of the penetrating hole H by electroplating, electroless plating, or the like and thus a via conductor 10 can be formed in the penetrating hole H. In this case, the depressions T1a and T1b of the film layer 7b are also plated and filled with part of the via conductor 10.

Figure 6B:
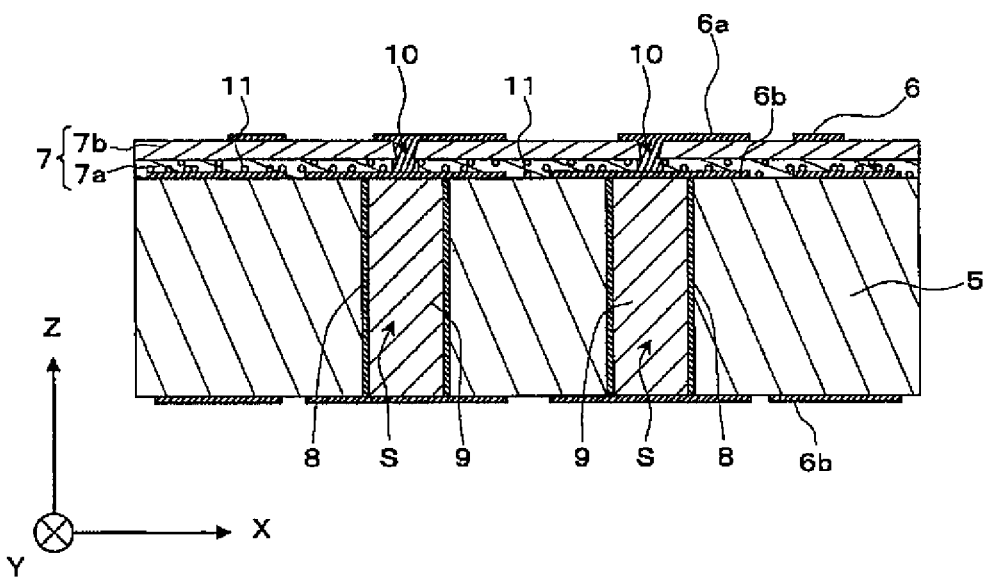

As shown in FIG. 6B, a signal line 6a is formed by applying a resist to one principal surface and the other principal surface of the core substrate 5 and performing exposure, development, and etching. The via conductor 10 can also be formed on the other principal surface of the core substrate 5 after the formation of the insulating layer 7 by the above-described method. Furthermore, by repeatedly performing the above-described steps of stacking the insulating layer 7 and the conductive layer 6, a circuit board with multilayer interconnection can be manufactured. A semiconductor device 4 is then mounted on the circuit board 2 through a bump 3 using a flip chip packaging technology, whereby the mounting structure 1 shown in FIG. 1 can be manufactured.

The present invention is not limited to the above-described embodiment, and various modifications and improvements can be made without departing from the scope of the present invention.

The invention claimed is:

1. A circuit board comprising an insulating layer in which a via conductor is embedded,
   wherein the insulating layer includes a plurality of depressions in a surface that contacts the via conductor, and projections of the via conductor are arranged in the depressions,
   wherein the depressions include first depressions arranged apart from each other and second depressions whose inner wall surfaces are curved surfaces and that are formed along a circumference in a continuous manner.

2. A mounting structure comprising the circuit board according to claim 1 and a semiconductor device which is flip-chip mounted on the circuit board.

3. A method for manufacturing a circuit board comprising:
   a step of providing a substrate including an insulating layer including a resin layer and a film layer stacked on the resin layer;
   a step of forming a first penetrating hole in the insulating layer by irradiating the insulating layer with a laser beam;
   a step of forming a second penetrating hole by etching part of the resin layer in an inner wall surface of the first penetrating hole such that the maximum opening diameter in the resin layer is larger than that in the film layer; and
   a step of forming a via conductor composed of a conductive material in the second penetrating hole.

4. The method for manufacturing a circuit board according to claim 3,
   wherein the step of forming the second penetrating hole includes:
      a step of pouring a first etching solution into the first penetrating hole in order to remove burnt residues produced when a surface of the first penetrating hole is irradiated with the laser beam; and
      a step of pouring a second etching solution into the first penetrating hole in order to etch the resin layer rather than the film layer and form the second penetrating hole.

5. The method for manufacturing a circuit board according to claim 3,
   wherein the insulating layer is irradiated with the laser beam in a direction from the film layer side to the resin layer side to form the first penetrating hole.

* * * * *